United States Patent
Cheah et al.

(10) Patent No.: US 7,262,608 B2
(45) Date of Patent: Aug. 28, 2007

(54) VIA ETCH MONITORING

(75) Inventors: Chin B. Cheah, Kedah Darul Aman (MY); Kandasamy Sundaram, Kedah Darul Aman (MY); Rajagopal Ramakrishnan, Kedah Darul Aman (MY); Arjun Kumar, Kedah Darul Aman (MY)

(73) Assignee: Silterra Malaysia Sdn. Bhd., Kedah Darul Aman (MY)

( * ) Notice: Subject to any disclaimer, the term of this patent is extended or adjusted under 35 U.S.C. 154(b) by 0 days.

(21) Appl. No.: 11/242,057

(22) Filed: Oct. 4, 2005

(65) Prior Publication Data

US 2006/0132148 A1 Jun. 22, 2006

(30) Foreign Application Priority Data

Oct. 11, 2004 (MY) .............................. PI 20044167

(51) Int. Cl.
*G01R 27/26* (2006.01)
*G01R 31/26* (2006.01)

(52) U.S. Cl. ...................................... 324/662; 324/719
(58) Field of Classification Search ................ 324/719, 324/663, 662, 761, 671
See application file for complete search history.

(56) References Cited

U.S. PATENT DOCUMENTS

| 5,646,538 A | * | 7/1997 | Lide et al. | ................... 324/662 |
| 5,838,161 A | * | 11/1998 | Akram et al. | ............... 324/755 |
| 2004/0227527 A1 | * | 11/2004 | Bortesi et al. | .............. 324/676 |

* cited by examiner

*Primary Examiner*—Andrew H. Hirshfeld
*Assistant Examiner*—Amy He
(74) *Attorney, Agent, or Firm*—Dickstein Shapiro LLP

(57) ABSTRACT

A method for monitoring the depth of at least one via (11) in a wafer including the steps of arranging the via (11) as a capacitive plate (21), providing a corresponding capacitive plate (23), applying an electrical potential difference to the via (11) and the corresponding capacitive plate (23), measuring the resultant capacitance between the via (11) and a corresponding capacitive plate (23) and determining the depth of the at least one via (11) by the capacitance.

14 Claims, 7 Drawing Sheets

VIA ETCH MONITORING

FIELD OF THE INVENTION

The present invention relates generally to via etching in semiconductor wafers. In particular, the present invention relates to a method of monitoring the depth of the vias etched in a wafer.

BACKGROUND OF THE INVENTION

A via is a vertical microscopic tunnel that penetrates selected inter-metal dielectric layers (IMDs) on the surface of a semi-conductor wafer and is filled with a conductive filler to provide an electrical flow path. Typically, the via is connected to a conductive layer at both its ends.

Vias are etched into a dielectric layer by exposing selected areas on the surface of the dielectric layer to etching processes. Where vias are not to be formed, the surface is covered with an etch-resistant material during etching, which is removed after the vias are etched. How deeply a via is etched into one or more dielectric layers depends on factors such as etch method, etch rate and etch time.

When the etch time is insufficient, the via does not penetrate sufficiently through the dielectric layer, or layers, into contact with an underlying conductive layer or device element. Therefore, vias are sometimes slightly over-etched to ensure that the vias are cleared of all dielectric material.

Several methods may be used to monitor sufficient via depth, such as profilometry, X-ray Scanning Electron Microscopy (X-SEM), Atomic Force Microscopy (AFM) and via resistance measurement. However, profilometry has limited accuracy in profiling surface features having dimensions as small as that of a via. SEM techniques are sample destructive and slow, since the IMD has to be cut to reveal the via cross-section, and are therefore unsuitable as quick means of quality control. AFM requires tedious changing of cantilever tips and is too troublesome to be incorporated into a manufacturing process for quality control. Via-chain resistance measurement is the most commonly used quick-detection technique for monitoring good via connections, which would mean that the vias are not under-etched. However, if the via connections are bad, i.e. have high resistance, via-chain resistance measurement cannot distinguish whether the bad connection is due to under-etching, or via-misalignment leading to non-contact with the underlying conductive layer. Furthermore, via-chain resistance measurement cannot tell us how much via depth is short in the event of under-etching.

It is, therefore, desirable to provide a method that is sensitive and quick in response for selectively detecting under-etching or via misalignment. It is preferable if the method is also able to indicate by how much the via depth is short of reaching the target depth.

SUMMARY OF THE INVENTION

The present invention relates to a method for monitoring via depth in inter-metal dielectric layers (IMDs) on a semi-conductor wafer. It is an object of the present invention to provide an improved method for of monitoring via depth.

The invention proposes in one aspect the use of capacitance to monitor via depth or placement.

The invention proposes in another aspect a method for determining a property of a via in a wafer comprising the steps of using the via as a first capacitive member, providing a second capacitive member, applying an electrical potential difference across the via and the corresponding capacitive member, measuring the resultant capacitance between the via and the second capacitive member and determining the property of the via from the capacitance.

In one specific embodiment, capacitance is obtained between vias separated into two groups, each group representing one of two capacitive plates. In another embodiment, all the vias are charged with the same charge, in bias as a capacitive plate against a conductor having the opposite charge being the corresponding capacitive plate.

BRIEF DESCRIPTION OF THE DRAWINGS

Embodiments of the invention will now be described, by way of example, with reference to the accompanying drawings, in which.

DESCRIPTION OF THE PREFERRED EMBODIMENT

Figure 1:
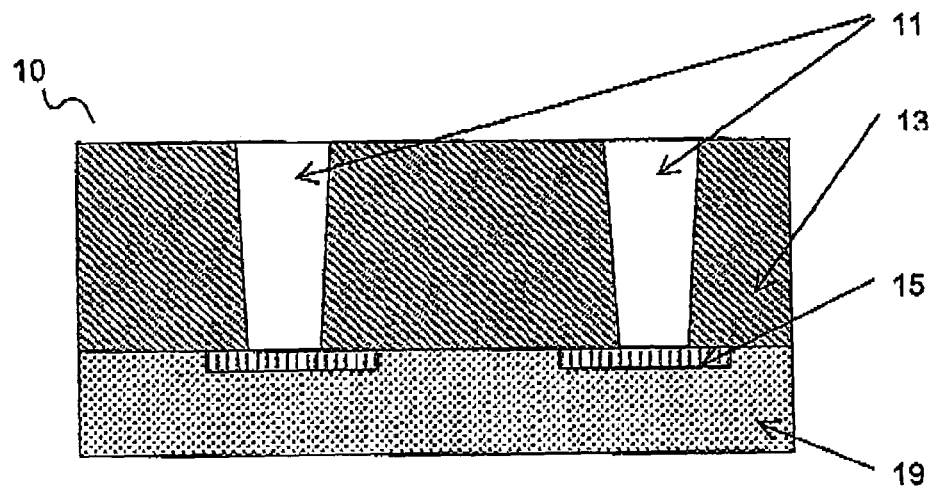
FIG. 1 is a schematic diagram of a dielectric layer in a wafer having vias.

FIG. 1 illustrates two inter-metal dielectric layers 13, 19 (IMD) of a semi-conductor wafer 10 having vias 11 etched through a first dielectric layer 13 into contact with a conductive layer 15 laid on the second dielectric layer 19. In a downstream process, the vias would be filled with conductive fillers before a further conductive layer (not shown) is laid on the first dielectric layer 13. It is important that a via thoroughly penetrates the dielectric layer 13 in order to contact conductive layers 15 on both ends.

Figure 2:
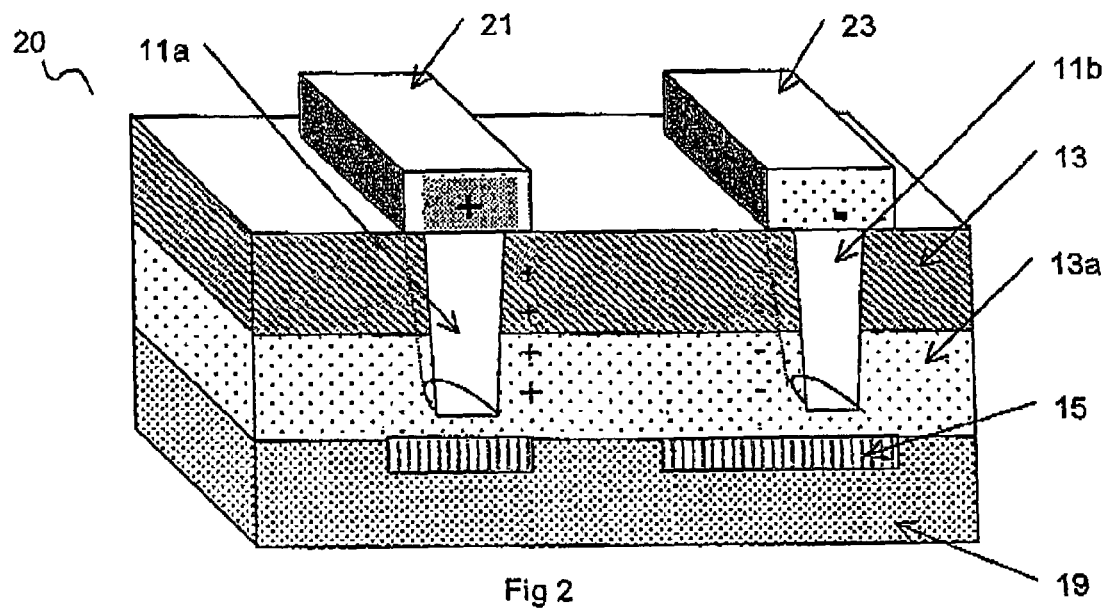
FIG. 2 is an isometric view of an embodiment of the present invention.

FIG. 2 is a schematic view of an embodiment 20 of the invention, which uses inter-via capacitance to monitor via depth. Three dielectric layers 13, 13a, 19 on a wafer is shown, the top two layers 13, 13a having vias 11a, 11b etched therethrough. The vias 11 are filled with the conductive fillers after etching to become conductive leads to the conductive layer 15 in the bottom-most dielectric layer 19. However, the vias 11a, 11b are stop-etched, i.e. under-etched, as they are not completely etched through the second layer 13a into contact with the conductive layer 15. To determine the depth of the vias 11a, 11b, two metallic electrical contacts, one being a positive connection 21 and the other the corresponding negative connection 23, are put into contact with the vias 11a, 11b. A voltage is applied to the electrical contacts 21, 23 and a resultant potential difference exists between the non-contacting vias 11a, 11b. The vias are thus electrically charged, the longitudinal surface of each via being charged with opposite charges. Therefore the longitudinal sides of one of the vias behaves as a positive plate 11a of a capacitor and that of the other via as the corresponding negative plate 11b.

Capacitance between two oppositely charged plates is defined as:

$$C = \frac{\varepsilon A}{d} \quad (1)$$

Where,

C=capacitance (fF).

A=total overlap area between a positive and a negative plate ($\mu m^2$).

$\varepsilon$=dielectric permitivity of vacuum between capacitive plates, e.g. $8.854 \times 10^{-3}$ (fF/$\mu$m) for vacuum.

d=distance between the overlapping areas ($\mu$m).

Equation (1) shows that the larger the area of overlap between two capacitive plates of opposite charges, the larger the resultant capacitance. Therefore, the depth of the vias 11a, 11b, which is directly proportional to the area of overlap at the sides of the vias 11a, 11b, directly correlate to the resultant capacitance.

Figure 3:
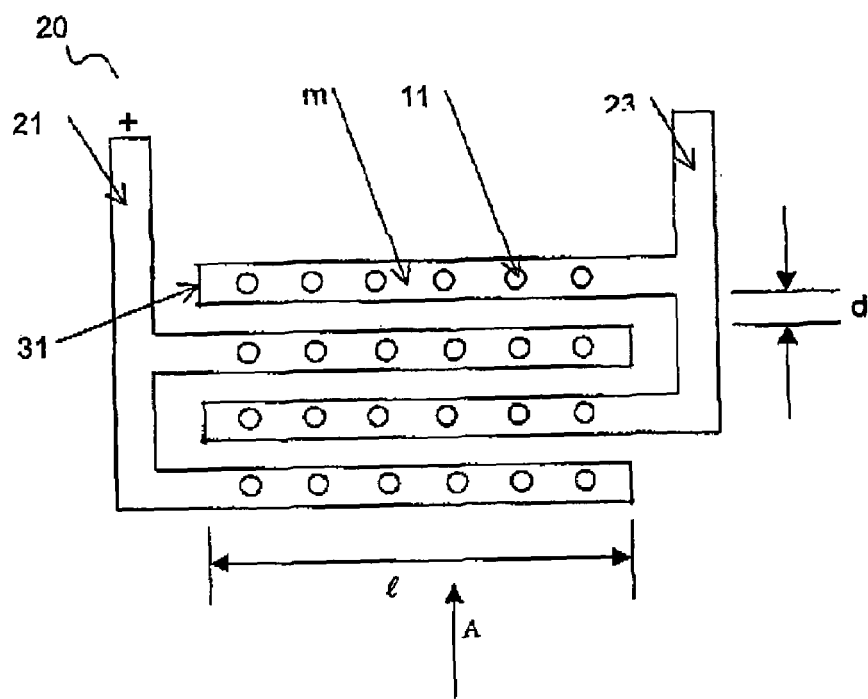
FIG. 3 is a schematic side view of the embodiment of FIG. 2.

FIG. 3 is a plan view of an embodiment which corresponds to the embodiment of FIG. 2, showing how, instead of just two vias 11a, 11b, two groups of several vias 11a, 11b are used as capacitive plates. The electrodes 21, 23 are comb-shaped shaped and are distributed parallel to a dielectric layer 13 underneath. Each electrode 21, 23 has fingers 31 interspersed with the fingers 31 of the other electrode 21, 23. Each finger 31 is also configured to contact a plurality of vias such that when a voltage is applied to the electrodes 21, 23, the vias are separated into two groups having opposite charges.

Figure 4:
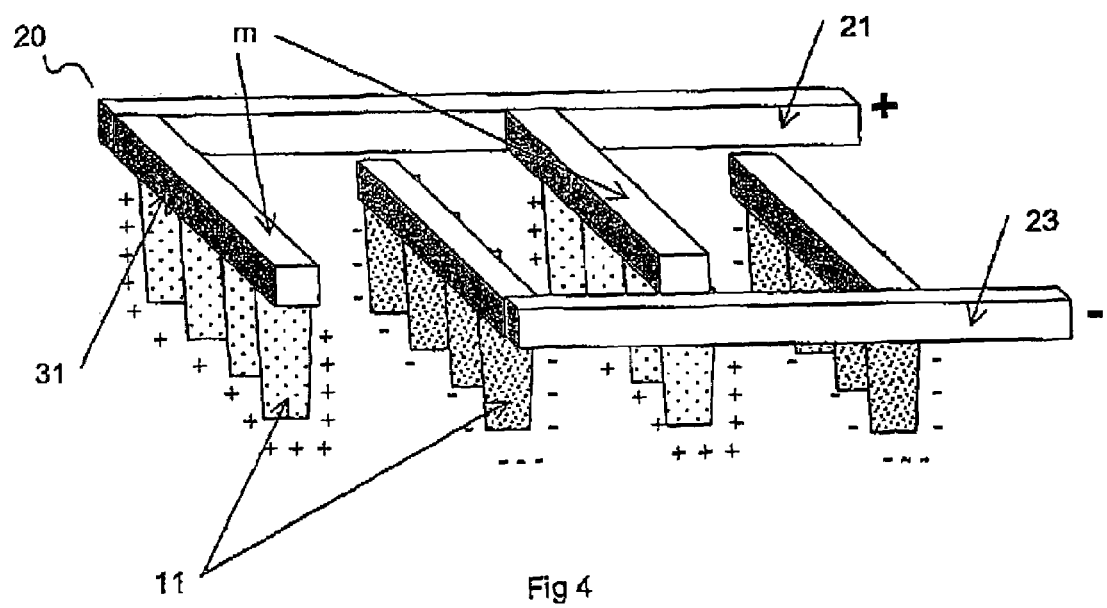
FIG. 4 is a schematic plan view of the embodiment of FIG. 2.

FIG. 4 shows an isometric view of the embodiment 20 of FIGS. 2 and 3. In practice, however, the total capacitance exerted between the electrodes and vias is a sum of both inter-via capacitance and inter-electrode capacitance. Thus, the capacitance between only the vias 11a, 11b is obtainable by subtracting the inter-electrode capacitance from the total capacitance.

Figure 5:
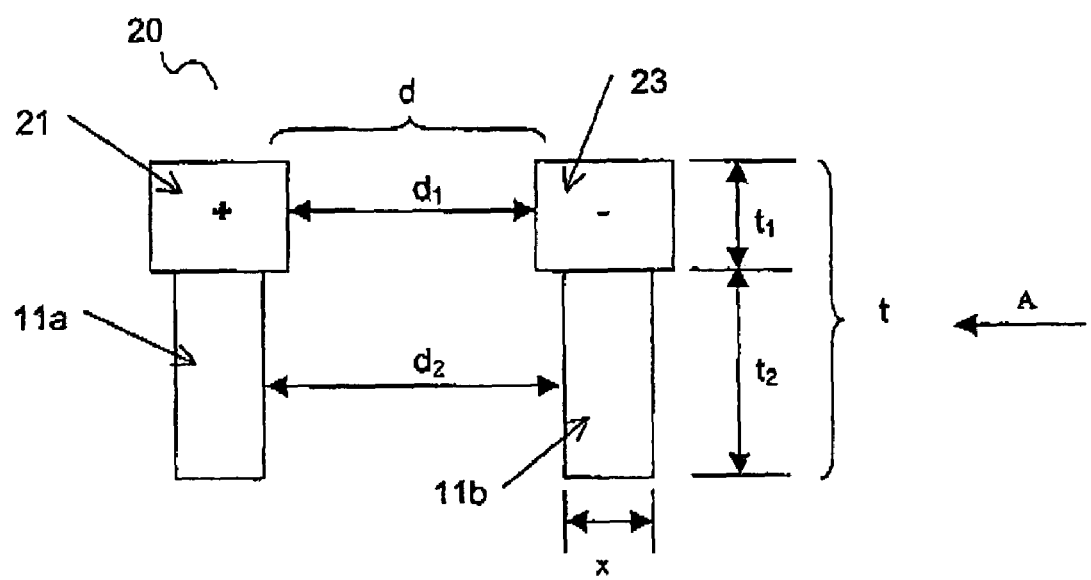
FIG. 5 is a further isometric view of the embodiment of FIG. 2.

Referring to FIG. 5 which represents the embodiment of FIG. 2 schematically and which corresponds to FIG. 3 when viewed from the direction indicated by the arrow 'A', the inter-electrode capacitance is:

$$C_1 = \frac{K \varepsilon l t_1}{d_1} \quad (2)$$

Where $C_1$=capacitance between the electrodes 21, 23.

K=relative dielectric permitivity of the dielectric film between the electrodes 21, 23, e.g. air.

$\varepsilon$=dielectric permitivity of vacuum, $8.854 \times 10^{-3}$ fF/$\mu m^2$.

l=the overlapping distance ($\mu$m) between two electrodes 31 of opposite charges.

$t_1$=height of the electrodes ($\mu$m).

$d_1$=distance between the positive and negative electrodes 11a, 11b ($\mu$m).

The inter-via capacitance can thus be obtained by subtracting the inter-electrode capacitance from the total capacitance:

$$C_{Total} = K\left(\frac{\varepsilon l t_1}{d_1} + \frac{\varepsilon n m (t_2 \cdot x)}{d_2}\right) \quad (3)$$

$$= C_{electrode} + K \frac{\varepsilon n m (t_2 \cdot x)}{d}$$

$$\therefore C_{Total} - C_{electrode} = K \frac{\varepsilon n m (t_2 \cdot x)}{d}$$

$$C_{via} = K \frac{\varepsilon n m (t_2 \cdot x)}{d}.$$

where $C_{electrode}$=capacitance between the electrodes 21, 23, as obtained from equation (2)

$C_{Total}$=total capacitance between the electrodes 21, 23 and vias 11a, 11b as measurable.

$C_{via}$=capacitance between the vias 11a, 11b.

K=relative dielectric permitivity of the dielectric material between the vias 11a, 11b and between the electrodes 21, 23. K value is assumed to be the same in this embodiment for both the materials between the vias and between the electrodes, even though air exists between the electrodes while a dielectric material exists between the vias.

$\varepsilon$=dielectric permitivity of vacuum, $8.854 \times 10^{-3}$ fF/$\mu m^2$.

l=the overlapping distance ($\mu$m) between two electrodes 31 of opposite charges.

$t_2$=etch depth of the vias ($\mu$m).

m=the number of metal fingers on each comb 21, 23 n=the number of vias 11 on each comb finger, m x=the average diameter of the via, i.e. Final Inspection Critical Dimension (FICD or via width).

$d_1$=distance ($\mu$m) between a pair of positive and negative electrodes 11a, 11b.

d2=distance ($\mu$m) between two corresponding vias 11a, 11b d=distance ($\mu$m) between two corresponding vias 11a, 11b (d2) and also distance between the corresponding electrodes 21, 23 (d1), assuming d=d1=d2.

The present embodiment 20 therefore allows the depth, t2, of vias to be monitored by inter-via capacitance by re-arranging equation (3)

$$t_2 = \frac{C_{via} \cdot d}{K \varepsilon n m x} \quad (3.1)$$

Figure 5A:
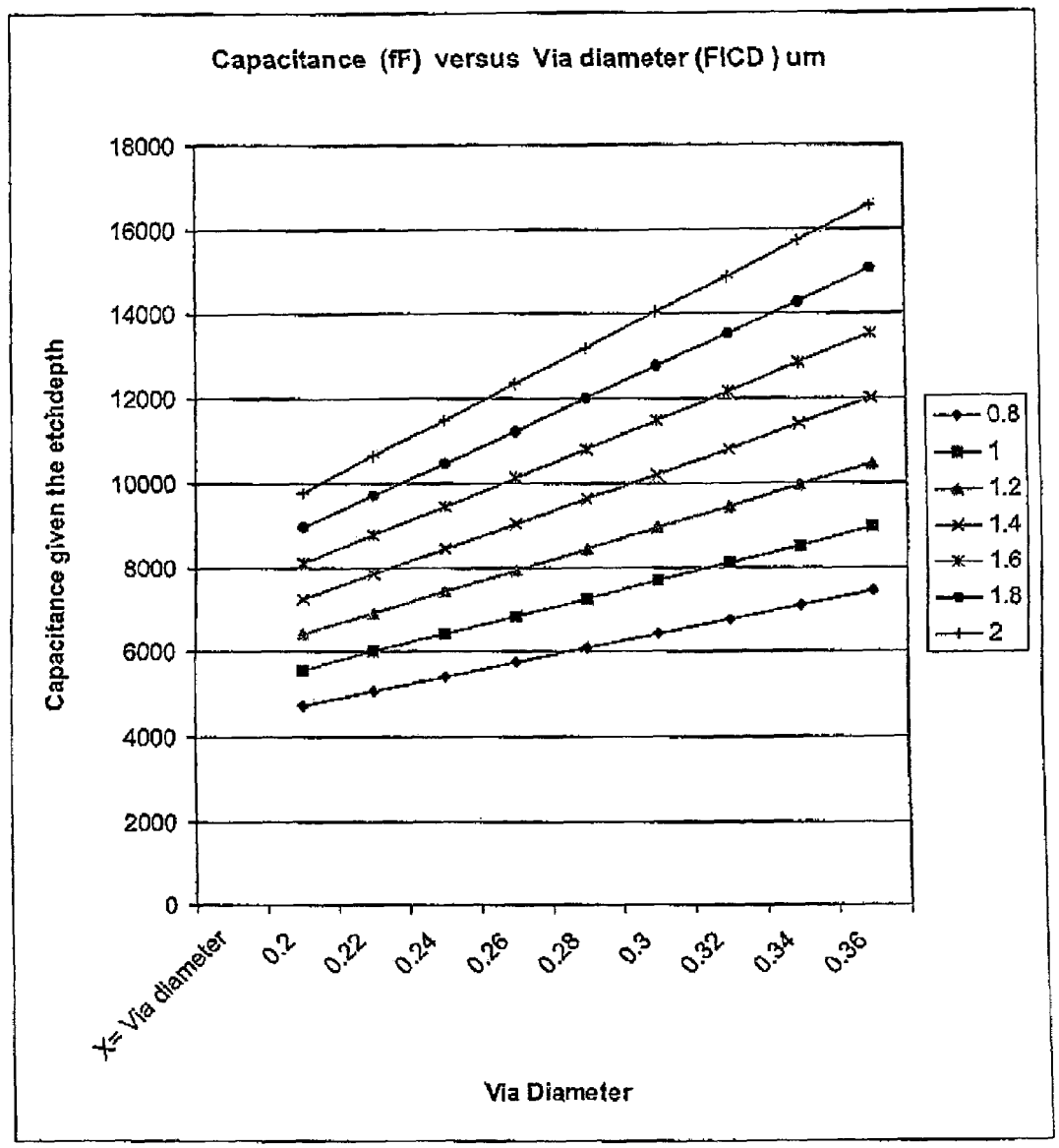
FIG. 5a shows a plot of via-Critical Dimension against capacitance according to the embodiment of FIG. 2.

For a more accurate measurement, a calibration is obtained to correlate via depth, or via-Critical Dimension (CD), to inter-via capacitance. FIG. 5a is a plot of equation (3), where critical dimensions of vias correlates to the inter-via capacitance depending on the via depth. FIG. 5a is obtained by substituting the following example values into equation (2) to get $C_1$=1312.29 fF:

K=4.15, $\varepsilon$=0.008854, l=100, $t_1$=100, $d_1$=0.28.

and by substituting the following example values into equation $$\frac{k \varepsilon n m (t_2 \cdot x)}{d_2}$$

to get 21199 ($t_2$.x) fF:
m=500
n=300
K=4.15
$\varepsilon$=0.008854
d=0.26

Substituting the values obtained above into the formulae (3) gives the following:

$$C = 21199(t_2.x) + 1312 \quad (3.2)$$

Using equation (3.2) to plot capacitance against via width (x), for every 0.2 μm increment in via depth ($t_2$) provides Table 1 and the graph of FIG. 5a.

TABLE 1

| x = Via diameter or width | $t_2$ = etchdepth | | | | | | |
|---|---|---|---|---|---|---|---|
| | 0.8 | 1 | 1.2 | 1.4 | 1.6 | 1.8 | 2 |
| 0.2 | 4703.8 | 5551.8 | 6399.8 | 7247.7 | 8095.7 | 8943.6 | 9791.6 |
| 0.22 | 5043.0 | 5975.8 | 6908.5 | 7841.3 | 8774.0 | 9706.8 | 10639.6 |
| 0.24 | 5382.2 | 6399.8 | 7417.3 | 8434.9 | 9452.4 | 10470.0 | 11487.5 |
| 0.26 | 5721.4 | 6823.7 | 7926.1 | 9028.4 | 10130.8 | 11233.1 | 12335.5 |
| 0.28 | 6060.6 | 7247.7 | 8434.9 | 9622.0 | 10809.2 | 11996.3 | 13183.4 |
| 0.3 | 6399.8 | 7671.7 | 8943.6 | 10215.6 | 11487.5 | 12759.5 | 14031.4 |
| 0.32 | 6738.9 | 8095.7 | 9452.4 | 10809.2 | 12165.9 | 13522.6 | 14879.4 |
| 0.34 | 7078.1 | 8519.7 | 9961.2 | 11402.7 | 12844.3 | 14285.8 | 15727.3 |
| 0.36 | 7417.3 | 8943.6 | 10470.0 | 11996.3 | 13522.6 | 15049.0 | 16575.3 |

If the vias 11 are thoroughly etched through the dielectric layer 13 into contact with the lower conductive layer 23, the capacitance would drop as the charge is conducted away. However, if the vias are etched to a sufficient depth but are misaligned, such that one or more vias do not come into contact with the underlying conductive layer 23, i.e. via misalignment, the capacitance remains high as a potential difference remains between the vias. Therefore, unlike via resistance measurement, the present embodiment indicates whether the cause of a bad connection is due to under-etching or misalignment.

Figure 6:
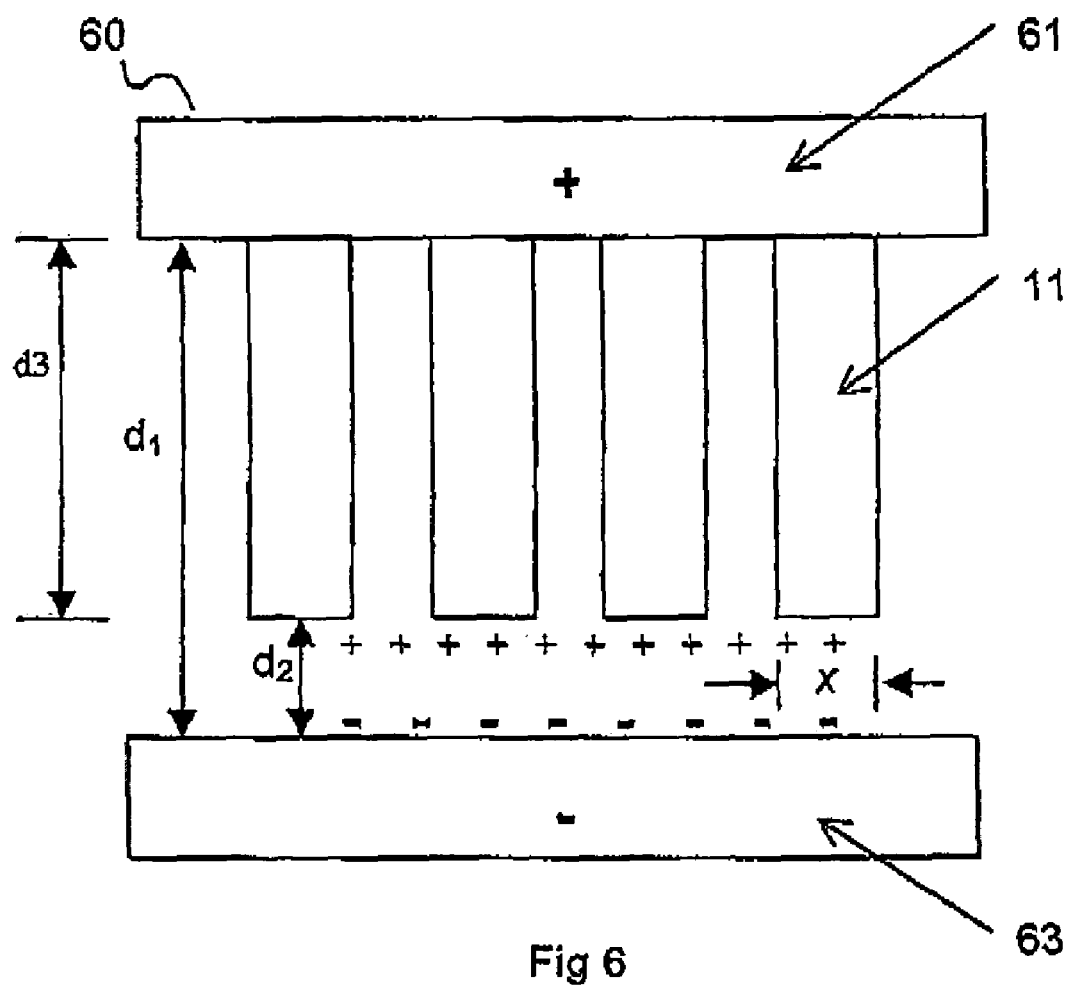
FIG. 6 is a schematic side view of another embodiment of the present invention.

FIG. 6 shows another embodiment 60 of the present invention, wherein the vias 11 are not separated as two oppositely charged plates to obtain inter-via capacitance. Instead, all the vias 11 are charged with the same charge from one top electrode 61, which is biased against an opposing electrode 63 underneath the vias 11. The bottom electrode 63 is a conductive metal layer and has an area that spans underneath the vias 11. The under-etched vias 11 therefore form several parallel capacitive plates corresponding to the bottom electrode 63. Typically, the opposing electrode has a thickness of 2×IMD thickness, e.g. about >15000 Å.

Figure 7:
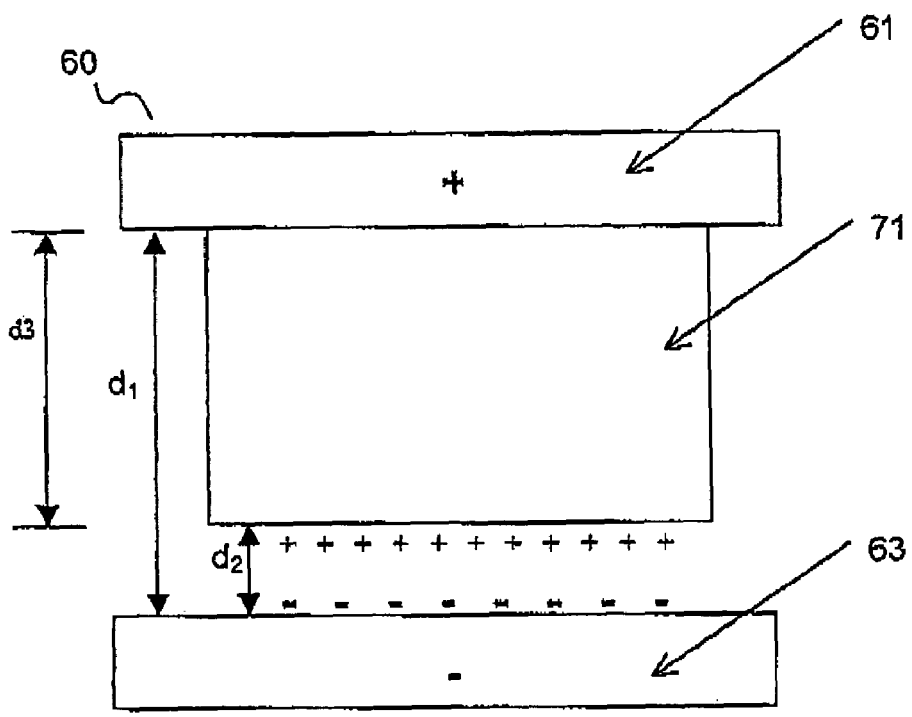
FIG. 7 is a further schematic view of the embodiment of FIG. 6.

Capacitance of parallel plates adds up according to the following relationship:

$$C_{parallel} = C_1 + C_2 + C_3 + \ldots C_n$$

where $C_{parallel}$ is total capacitance; and
$C_1, C_2, C_3$ to ... $C_n$ are capacitors in parallel up to a total number of n capacitors Therefore, the capacitance between the vias and the oppositely charged bottom electrode 63 can be treated mathematically as between one combined via and the bottom electrode 63, as illustrated in FIG. 7.

Figure 8:
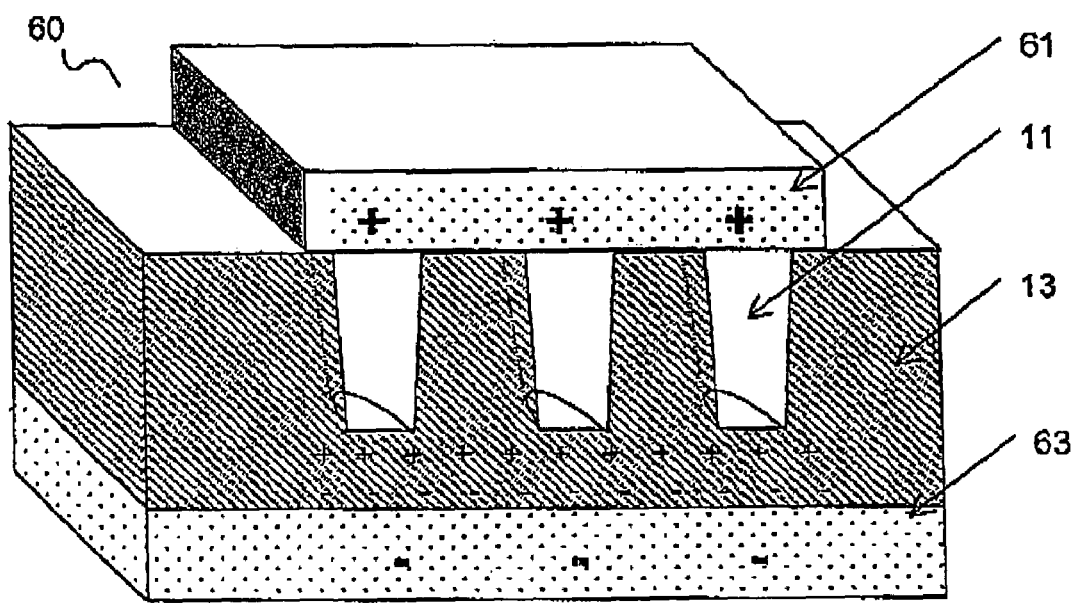
FIG. 8 is an isometric view of the embodiment of FIG. 6.

FIG. 8 shows an isometric view of the embodiment of FIG. 6. The vias 11 are etched through a dielectric layer 13, filled with a conductive filler, and is in contact with an electrode 61 of one charge. An opposing electrode 63 is beneath the vias so that there is a resultant capacitance between the vias 11 and the electrode 63 when a potential is applied thereto, Therefore, the depth of the vias 11, $d_3$, relates to the distance, $d_2$, between the plates of a capacitor. According to equation (1), capacitance increases as d decreases. The efficiency of the etching process on the depth of the vias can therefore be monitored by the via-electrode capacitance.

However, the total capacitance in the configuration of this embodiment 60 is a sum of the capacitance between the top electrode 61 and the bottom electrode 63 in areas where there is no via, and the capacitance between the vias 11 and the electrode 63 where the are vias 11. Therefore, in order to obtain the capacitance between only the vias 11 and the bottom electrode 63, the capacitance between the top electrode 61 and the bottom electrode 63 has to be subtracted from the total capacitance.

The capacitance between the electrodes 61, 63 without the presence of vias 11 is defined by:

$$C_{electrodes} = \frac{K\varepsilon A}{d_1} \quad (4)$$

where, $C_{electrode}$=capacitance between the electrodes 61, 63.
A=area of overlap between the plates, μm²
$\varepsilon$=dielectric permitivity of vacuum, 8.854×10⁻³ fF/μm².
K=relative dielectric permitivity of the dielectric film between the electrodes 21, 23.
$d_1$=distance (μm) between the electrodes 61, 63

Accordingly, the capacitance between the vias and the bottom electrode 63, $C_{via}$, can be found thus:

$$C_{Total} = \frac{\varepsilon(A - nx^2)}{d_1} + \frac{\varepsilon n x^3}{d_3 - d_1} \quad (5)$$

$$C_{Total} = K\frac{\varepsilon A}{d_1} - \frac{\varepsilon n x^2}{d_1} + \frac{\varepsilon n x^2}{d_3 - d_1}$$

$$C_{Total} = K\frac{\varepsilon A}{d_1} - \varepsilon n x^2 \frac{1}{d_1} + \frac{1}{d_3 - d_1}$$

$$C_{Total} = C_{electrode} - K\varepsilon n x^2 \frac{1}{d_1} + \frac{1}{d_3 - d_1}$$

$$C_{Total} = C_{electrode} - K\varepsilon n x^2 \frac{1}{d_3 - d_1} - \frac{1}{d_1}$$

$$\therefore C_{Total} - C_{electrode1} = K\varepsilon n x^2 d_3 \frac{1}{(d_1 - d_3)d_1}$$

$$C_{via} = K\varepsilon n x^2 d_3 \frac{1}{(d_1 - d_3)d_1}$$

where, $C_{electrode}$=capacitance between the electrodes 61, 63.
$C_{Total}$=total capacitance between the electrodes and vias 61, 11, 63.
$C_{via}$=capacitance between the vias 11 and the bottom electrode 63.
K=relative dielectric permitivity of the dielectric film between the electrodes 61, 63 and vias 11.
$\varepsilon$=dielectric permitivity of vacuum, 8.854×10⁻³ fF/μm².

$d_1$=distance (µm) between the electrodes 61, 63

$d_2$=distance (µm) between the bottom of the vias 11 and the lower electrode 63.

$d_3$=etch depth of the vias=$d_1-d_2$ (µm)

n=the number of vias 11 on each comb finger, m x=the bottom surface width of the circular via. For simplicity, the area of the bottom of the via is approximated to be $x^2$ in this embodiment. In practice, the value depends on via dimension (µm$^2$).

Figure 9:
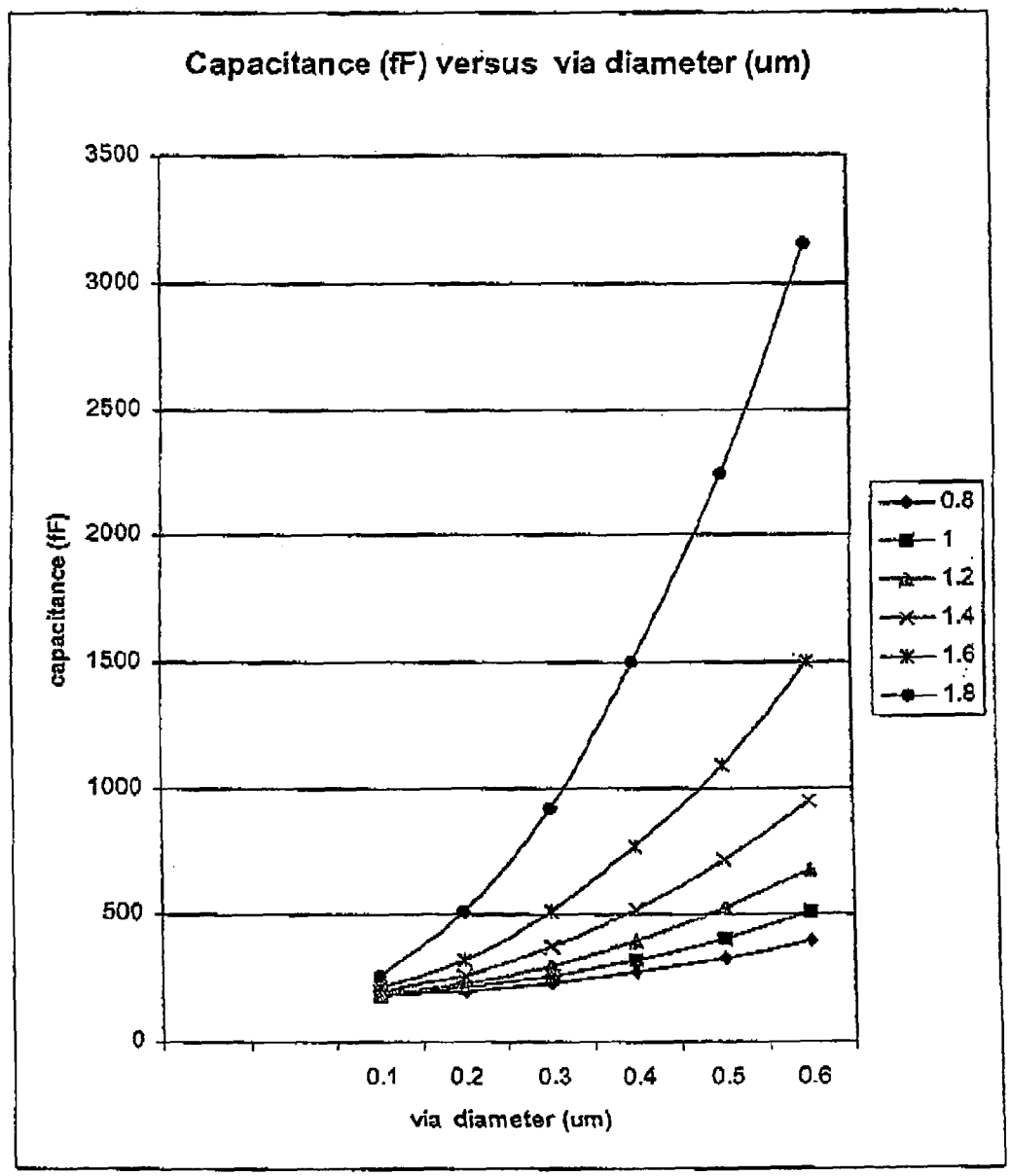
FIG. 9 shows a plot of via-Critical Dimension against capacitance according to the embodiment of FIG. 6.

FIG. 9 is a plot of equation (5), where critical dimension (FICD, or width of the Via plug) of the vias has a correlation to via capacitance depending on the via depth. Therefore the depth of the vias 11 can be monitored based on the capacitance between the vias 11 and the bottom electrode 63.

Substituting the following example values into equation (4) to obtain C1=174.97 fF:

n=50000

K=4.15

∈=0.008854

A=100*100 d=2.1

Substituting the following example values into equation (5)

$$C_{Total} = K\varepsilon n x^2 d_3 \frac{1}{(d_1-d_3)d_1} + C_{electrode1}$$

$d_1$=IMD total thickness=2

K.∈.n=50000×0.008854×4.15=1837.205 gives $$C_{Total} = 1837x^2 d_3 \frac{0.5}{(2-d_3)} + 174.9 \quad (5.1)$$

or $$C_{Total} = 918x^2 \frac{d_3}{(2-d_3)} + 174.9$$

Using equation (5.1) to plot capacitance against via width (x), for every 0.2 um increment in via depth ($d_3$) provides Table 2 and the graph of FIG. 9.

TABLE 2

| X = Via diameter or width | $d_3$ = etch depth | | | | | |
|---|---|---|---|---|---|---|
| | 0.8 | 1 | 1.2 | 1.4 | 1.6 | 1.8 |
| 0.1 | 181.0 | 184.1 | 188.7 | 196.3 | 211.6 | 257.5 |
| 0.2 | 199.4 | 211.6 | 230.0 | 260.6 | 321.8 | 505.4 |
| 0.3 | 230.0 | 257.5 | 298.8 | 367.7 | 505.4 | 918.5 |
| 0.4 | 272.8 | 321.8 | 395.2 | 517.6 | 762.4 | 1496.8 |
| 0.5 | 327.9 | 404.4 | 519.2 | 710.4 | 1092.9 | 2240.4 |
| 0.6 | 395.2 | 505.4 | 670.6 | 946.0 | 1496.8 | 3149.2 |

A quick and sensitive method of detecting under-etch has been disclosed. In particular, the embodiments provide a method of monitoring via depth using capacitance. As the embodiments monitor via depth in a quick, simple and non-destructive way, they can be used on every wafer during wafer manufacturing for quality control.

Other than monitoring via depth, the embodiments can be used to monitor depth and alignment of other etched features on an IMD, such as via contacts with the wafer surface (instead of with an underlying metal layer), Dual Damascene vias, Local Interconnects, etc.

Where the via depth is known, the embodiments can also be used for determining the dielectric constant of the dielectric layer. The embodiments can also be used for comparing microloading effects between alignment mark and via features. The embodiments can also be used to monitor via depth consistency in a situation where the thickness of the dielectric layers on different wafers vary and where performance varies between etch machines. Therefore, recipe setups between machines can be obtained quickly. Furthermore, wafer-wafer or lot-lot comparisons can be made using the embodiments to control consistency in product quality.

Tables 1 and 2, as well as the graphs of FIGS. 5*a* and 9 show that the present embodiment is also useable to monitor the diameters of vias, as well depths. The correlation can be used to derive etch depth and, subsequently, calculating the via width. On obtaining the via width and the etch depth, the proportion of the measured capacitance contributed by the via width can be isolated from the capacitance contributed by the etch depth.

Although only several embodiments are described, it should be understood that the embodiments described herein are but embodiments of underlying concepts of the invention. Alternatives to the embodiments, though not described, are intended to be within the scope of this invention as claimed.

The invention claimed is:

1. A method for determining a property of a via extending through a dielectric layer in a wafer comprising the steps of:
   using the via as a first capacitive member;
   providing a second capacitive member;
   applying an electrical potential difference across the via and the corresponding capacitive member;
   measuring the resultant capacitance between the via and the second capacitive member; and
   determining the depth of the via from the capacitance.

2. A method as claimed in claim 1 wherein a further via forms the second capacitive member.

3. A method as claimed in claim 1 wherein a plurality of vias form the first capacitive member.

4. A method as claimed in claim 2 wherein a plurality of vias form the second capacitive member.

5. A method as claimed in claim 2 wherein the longitudinal surfaces of the via and the further via are aligned.

6. A method as claimed in claim 1 wherein a single electrode provides the second capacitive member.

7. A method as claimed in claim 1 further comprising the step of using the determined depth of the via for quality control.

8. A method for determining a property of a via extending through a dielectric layer in a wafer comprising the steps of:
   using the via as a first capacitive member;
   providing a second capacitive member;
   applying an electrical potential difference across the via and the corresponding capacitive member;
   measuring the resultant capacitance between the via and the second capacitive member; and
   determining the horizontal alignment of the via from the capacitance.

9. A method as claimed in claim 8 wherein a further via forms the second capacitive member.

10. A method as claimed in claim 9 wherein the longitudinal surfaces of the via and the further via are aligned.

11. A method as claimed in claim 8 wherein a plurality of vias form the first capacitive member.

12. A method as claimed in claim 9 wherein a plurality of vias form the second capacitive member.

13. A method as claimed in claim 8 wherein a single electrode provides the second capacitive member.

14. A method as claimed in claim 8 further comprising the step of using the determined horizontal alignment of the via for quality control.

* * * * *